United States Patent
Eriksson et al.

(10) Patent No.: US 8,983,058 B2
(45) Date of Patent: Mar. 17, 2015

(54) ECHO CANCELLER AND A METHOD THEREOF

(75) Inventors: Anders Eriksson, Uppsala (SE); Per Ahgren, Knivsta (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 15 days.

(21) Appl. No.: 13/641,967

(22) PCT Filed: Apr. 22, 2010

(86) PCT No.: PCT/SE2010/050441
§ 371 (c)(1),
(2), (4) Date: Oct. 18, 2012

(87) PCT Pub. No.: WO2011/133075
PCT Pub. Date: Oct. 27, 2011

(65) Prior Publication Data
US 2013/0044872 A1    Feb. 21, 2013

(51) Int. Cl.
*H04M 9/08* (2006.01)
*H04B 3/23* (2006.01)
*H03H 21/00* (2006.01)

(52) U.S. Cl.
CPC ............... *H04M 9/082* (2013.01); *H04B 3/23* (2013.01); *H03H 2021/0083* (2013.01)
USPC .................. 379/406.08; 381/71.11

(58) Field of Classification Search
CPC ... H04M 9/082; H04M 3/56; H04M 2201/41; H04M 19/08; H04M 1/6033; H04M 1/6091; H04M 1/725; H04M 3/34; H04M 9/005; H04M 1/2535; H04M 9/08; H04B 3/23; H04B 3/234; H04B 3/237; H04B 3/235; H04B 3/32; H03H 21/0012; H03H 2021/0083; H03H 2021/0089; H03H 21/0043; G10L 21/0208; G10L 2021/02082; G10L 25/18; G10L 2021/02165; H04L 2025/0349; H04L 25/03057; H04L 2025/03745; H04R 3/02; H04R 1/1083; H04R 2225/41; H04R 2410/05
USPC .............. 379/406.01–406.16; 381/71.1–71.4; 455/570
See application file for complete search history.

(56) References Cited

U.S. PATENT DOCUMENTS

| | | |
|---|---|---|
| 6,618,481 B1 | 9/2003 | Schmidt |
| 2003/0219113 A1 | 11/2003 | Bershad et al. |

(Continued)

FOREIGN PATENT DOCUMENTS

| | | |
|---|---|---|
| EP | 0422796 A2 | 9/1990 |
| EP | 1577879 A1 | 9/2005 |

OTHER PUBLICATIONS

Extended European Search Report from corresponding application EP10850343, dated Jul. 15, 2013, 6 pages.

*Primary Examiner* — Akelaw Teshale
(74) *Attorney, Agent, or Firm* — Rothwell, Figg, Ernst & Manbeck P.C.

(57) ABSTRACT

The present invention relates to an echo canceller (300) for estimating a model of an echo signal and a method thereof. The echo canceller comprises at least an adaptive main filter (301) for modeling the echo signal and an adaptive shadow filter (302) for modeling the echo signal. The adaptive main filter is an adaptive filter for which the adaptation speed is proportional to a system noise estimate and the adaptation speed of the shadow filter (302) is faster than the adaptation speed of the adaptive main filter (301). The echo canceller (300) comprises a processor (303) for determining whether the adaptive shadow filter models the echo signal better than the adaptive main filter and an updater (304) for updating the system noise estimate of the adaptive main filter (301) if the adaptive shadow filter models (302) the echo signal better than the adaptive main filter (301).

17 Claims, 4 Drawing Sheets

(56) References Cited

U.S. PATENT DOCUMENTS

2004/0071284 A1* 4/2004 Abutalebi et al. ........ 379/406.08
2007/0189506 A1 8/2007 Hsu et al.
2007/0274535 A1 11/2007 Mao
2009/0116638 A1* 5/2009 Gough et al. ............ 379/406.09

* cited by examiner

ECHO CANCELLER AND A METHOD THEREOF

CROSS-REFERENCE TO RELATED APPLICATION

This application is a 35 U.S.C. §371 National Phase Entry Application from PCT/SE2010/050441, filed Apr. 22, 2010, and designating the United States, the disclosure of which is incorporated by reference herein.

TECHNICAL FIELD

The present invention relates to an echo canceller and a method thereof, and in particular to an improvement of the echo estimation.

BACKGROUND

Echo cancellers improve the voice quality in a voice communication by removing the echo from the voice communication. Such an echo canceller is exemplified in FIG. 1. $x(t)$ is the speaker signal, $y(t)$ is the microphone signal, $s(t)$ is the echo from the speakers, $v(t)$ is the near-end signal and $H(z)$ represents adaptive filters.

Echo cancellers are based on estimating a model of the echo signal, usually implemented as an FIR (Finite Impulse Response) filter. Due to the time variations in the echo path, the model needs to be continuously adapted.

A Kalman filter is an example of a FIR filter which can be used for implementing the linear filter adaptation. The Kalman filter is given by $$h(t+1) = h(t) + K(t) \cdot (y(t) - X^T(t)h(t))$$

$$K(t) = \frac{P(t)X(t)}{R_2(t) + X^T(t)P(t)X(t)}$$

$$P(t+1) = P(t) + R_1(t) - K(t)X^T(t)P(t)$$

The computation of the updating gain in the Kalman filter includes the covariance matrix $P(t)$ that has a dimension equal to the filter order. Hence, the computational load of the Kalman filter is in many situations prohibitively large for real-time implementation of echo cancellation.

Several approximations of the Kalman filter have been proposed to reduce the computational load and in particular the Normalized Least Mean Squares method for updating FIR filters with adaptive step-size computations can be viewed as an approximate Kalman filter implementation.

For speech signals, it is advantageous to implement the NLMS in the frequency domain, particularly for high sample rates. In order to handle long impulse responses, a partitioned block structure where the impulse response of the echo path is segmented into $n_p$ consecutive blocks of length P coefficients is used, $$H_{echo}(z) = \sum_{n=0}^{(n_p-1)\cdot P} h_n \cdot z^{-n} = \sum_{p=1}^{n_p} \sum_{n=0}^{P-1} h_{p,n} \cdot z^{-(p-1)\cdot P - n}$$

$$H_p(f) = FFT\left(\begin{bmatrix} h_{p,0} \\ M \\ h_{p,P-1} \\ 0_{M-P} \end{bmatrix}\right),$$

$$p = 1, K, n_P$$

$$X_p(k, f) = FFT\left(\begin{bmatrix} x(k \cdot L - (p-1)\cdot P - M + 1) \\ M \\ x(k \cdot L - (p-1)\cdot P) \end{bmatrix}\right),$$

$$p = 1, K, n_P$$

$$S(f) = \sum_{p=1}^{n_P} H_p(f) \cdot X_p(f)$$

$$\left(\begin{bmatrix} P \\ 0_{M-L} \\ s(k \cdot L - 1) \\ M \\ s(k \cdot L) \end{bmatrix}\right) = IFFT(S(f))$$

where $x(t)$ is the loudspeaker signal, $s(t)$ is the echo, $L$ is the data frame length, and $M$ is the FFT length.

Each partition is recursively estimated as $$H_p(k, f) = H_p(k-1, f) + \alpha(k, f) \cdot (E(k, f) \cdot X_p^*(k, f)),$$

$$p = 1, K, n_P$$

where $$E(k, f) = FFT\left(\begin{bmatrix} P \\ 0_{M-L} \\ e(k \cdot L - 1) \\ M \\ e(k \cdot L) \end{bmatrix}\right) = FFT\left(\begin{bmatrix} P \\ 0_{M-L} \\ y(k \cdot L - 1) \\ M \\ y(k \cdot L) \end{bmatrix}\right) - FFT\left(\begin{bmatrix} P \\ 0_{M-L} \\ s(k \cdot L - 1) \\ M \\ s(k \cdot L) \end{bmatrix}\right)$$

where $y(t)$ is the microphone signal and $\alpha(k, f)$ is the update gain factor.

From an analysis of the expected variance of the estimation error of the filter coefficients, i.e. $|H_m(k, f) - H_0(k, f)|^2$ where $H_0(k, f)$ denotes the filter coefficients of a linear filter modeling the echo, an adaptive updating gain that minimizes the expected estimation error may be implemented by choosing $\alpha(k, f)$ as $\kappa(k, f)$ updated by $$\kappa(k, f) = \frac{R_H(k-1, f)}{n_P \frac{P}{M} \cdot R_X(k, f) \cdot R_H(k-1, f) + n_P \frac{P}{L} R_V(k, f)}$$

$$R_H(k, f) = \left(1 - \frac{L}{M} \cdot \kappa(k, f) \cdot R_X(k, f)\right) \cdot R_H(k-1) + Q(k, f)$$

where $$R_X(k, f) = \frac{1}{n_P} \sum_{p=1}^{n_P} |X_p(k, f)|^2,$$

$$R_V(k, f) = |E(k, f)|^2 \approx |V(k, f)|^2$$

Comparing this to the expression for the regular Kalman filter gives that
- $R_H(k, f)$ corresponds to the diagonal elements of $P(t)$
- $Q(k, f)$ corresponds to $R_1(t)$ (the variance of the system noise) and may be used to model non-stationarities in the echo path
- $R_V(k, f)$ corresponds to $R_2(t)$ and estimates the variance additive measurement noise A fundamental problem with acoustic echo cancellation is to allow re-adaptation in situations where the echo path has changed and retain good echo attenuation in situations with a strong noise component i.e. double-talk conditions.

A common solution to the problem of discriminating double talk from echo path changes is to use a dual-filter structure. This incorporates having two adaptive filters where the filter coefficients are transferred from one filter to the other when either filter is performing significantly better than the other. These schemes pose several problem of determining when either filter is performing significantly better, and also the transfer of filter coefficients may not be suitable when the lengths of the respective filters differs significantly.

SUMMARY

An object of the present invention is to provide an improved echo canceller.

According to a first aspect of the present invention a method for estimating a model of an echo signal in an echo canceller is provided. The echo canceller comprises at least an adaptive main filter for modeling the echo signal and an adaptive shadow filter for modeling the echo signal. The adaptive main filter is an adaptive filter for which the adaptation speed is proportional to a system noise estimate and the adaptation speed of the shadow filter is faster than the adaptation speed of the adaptive main filter. In the method, it is determined whether the adaptive shadow filter models the echo signal better than the adaptive main filter. If the adaptive shadow filter models the echo signal better than the adaptive main filter, the system noise estimate of the adaptive main filter is updated.

According to a second aspect of the present invention, an echo canceller for estimating a model of an echo signal is provided. The echo canceller comprises at least an adaptive main filter for modeling the echo signal and an adaptive shadow filter for modeling the echo signal. The adaptive main filter is an adaptive filter for which the adaptation speed is proportional to a system noise estimate and the adaptation speed of the shadow filter is faster than the adaptation speed of the adaptive main filter. The echo canceller comprises a processor for determining whether the adaptive shadow filter models the echo signal better than the adaptive main filter and an updater for updating the system noise estimate of the adaptive main filter if the adaptive shadow filter models the echo signal better than the adaptive main filter.

An advantage with embodiments of the present invention is that a robust and fast solution for discriminating between double talk and echo path changes for echo canceller is provided.

DETAILED DESCRIPTION

Figure 1:
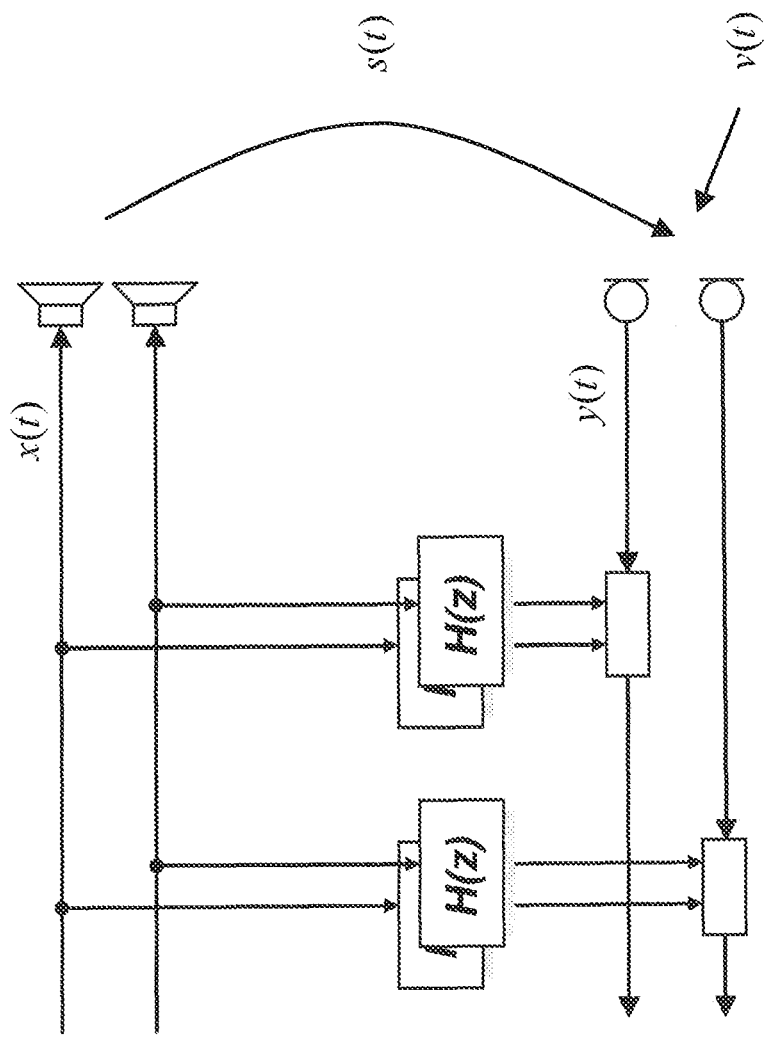
FIG. 1 illustrates linear filters in echo cancellation according to prior art.

The present invention will be described more fully hereinafter with reference to the accompanying drawings, in which preferred embodiments of the invention are shown. The invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like reference signs refer to like elements.

Moreover, those skilled in the art will appreciate that the means and functions explained herein below may be implemented using software functioning in conjunction with a programmed microprocessor or general purpose computer, and/or using an application specific integrated circuit (ASIC). It will also be appreciated that while the current invention is primarily described in the form of methods and devices, the invention may also be embodied in a computer program product as well as a system comprising a computer processor and a memory coupled to the processor, wherein the memory is encoded with one or more programs that may perform the functions disclosed herein.

The present invention relates to updating of the adaptive filters used in echo cancellers to improve the estimation of a model of the echo signal.

The basic concept of the invention is to extract information from an adaptive shadow filter to an adaptive main filter if the adaptive shadow filter models the echo better than the adaptive main filter. The adaptive main filter is exemplified by a Kalman filter in the description below, but it should it be noted that other filters types also may be used such as other types of Kalman filter realizations, Infinite Impulse Response filter, non-linear filters. It should also be understood that the adaptive main filter is also referred to as a main filter and the adaptive shadow filter is also referred to as a shadow filter.

Figure 3:
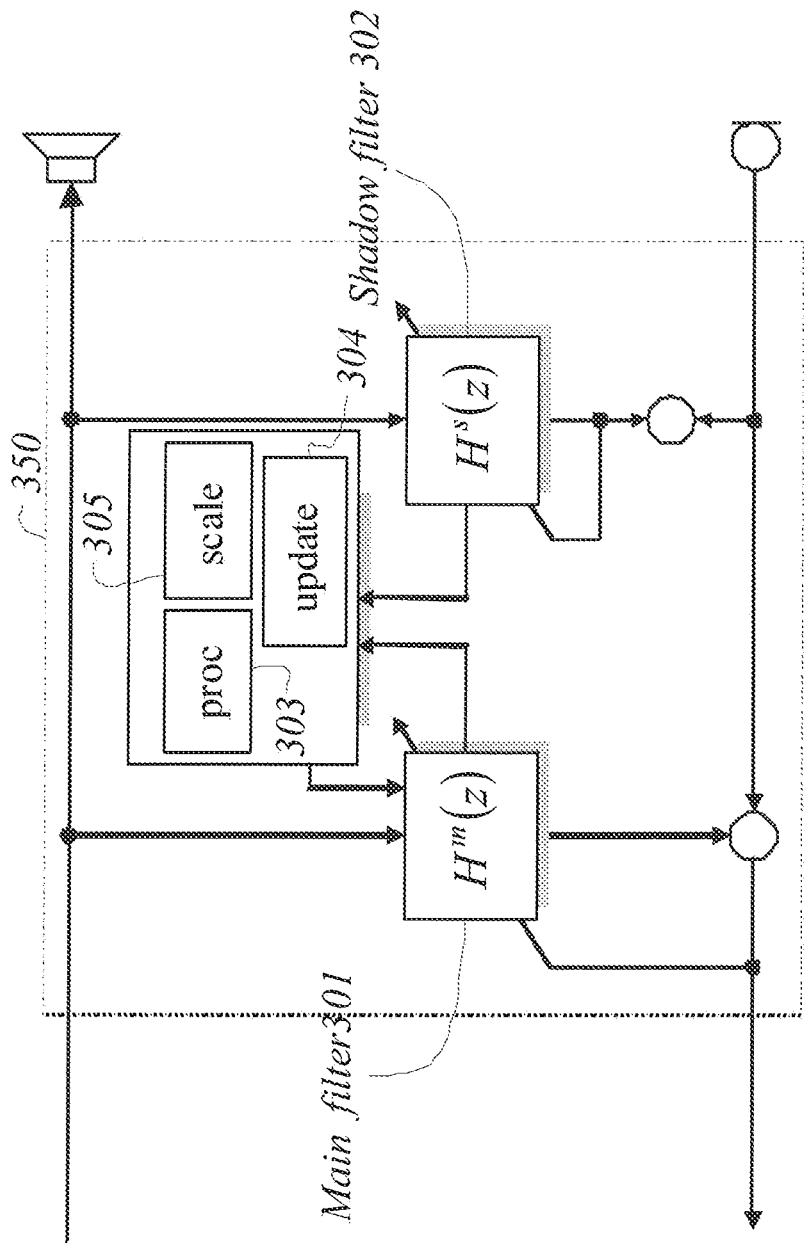
FIG. 3 illustrates an echo canceller according to embodiments of the present invention.

According to embodiments of the present invention an echo canceller 300 for estimating a model of an echo signal is provided as illustrated in FIG. 3. The echo canceller 300 comprises at least an adaptive main filter 301 for modeling the echo signal and an adaptive shadow filter 302 for modeling the echo signal, wherein the adaptive main filter is an adaptive filter for which the adaptation speed is proportional to a system noise estimate and the adaptation speed of the shadow filter 302 is faster than the adaptation speed of the adaptive main filter 301.

Figure 2:
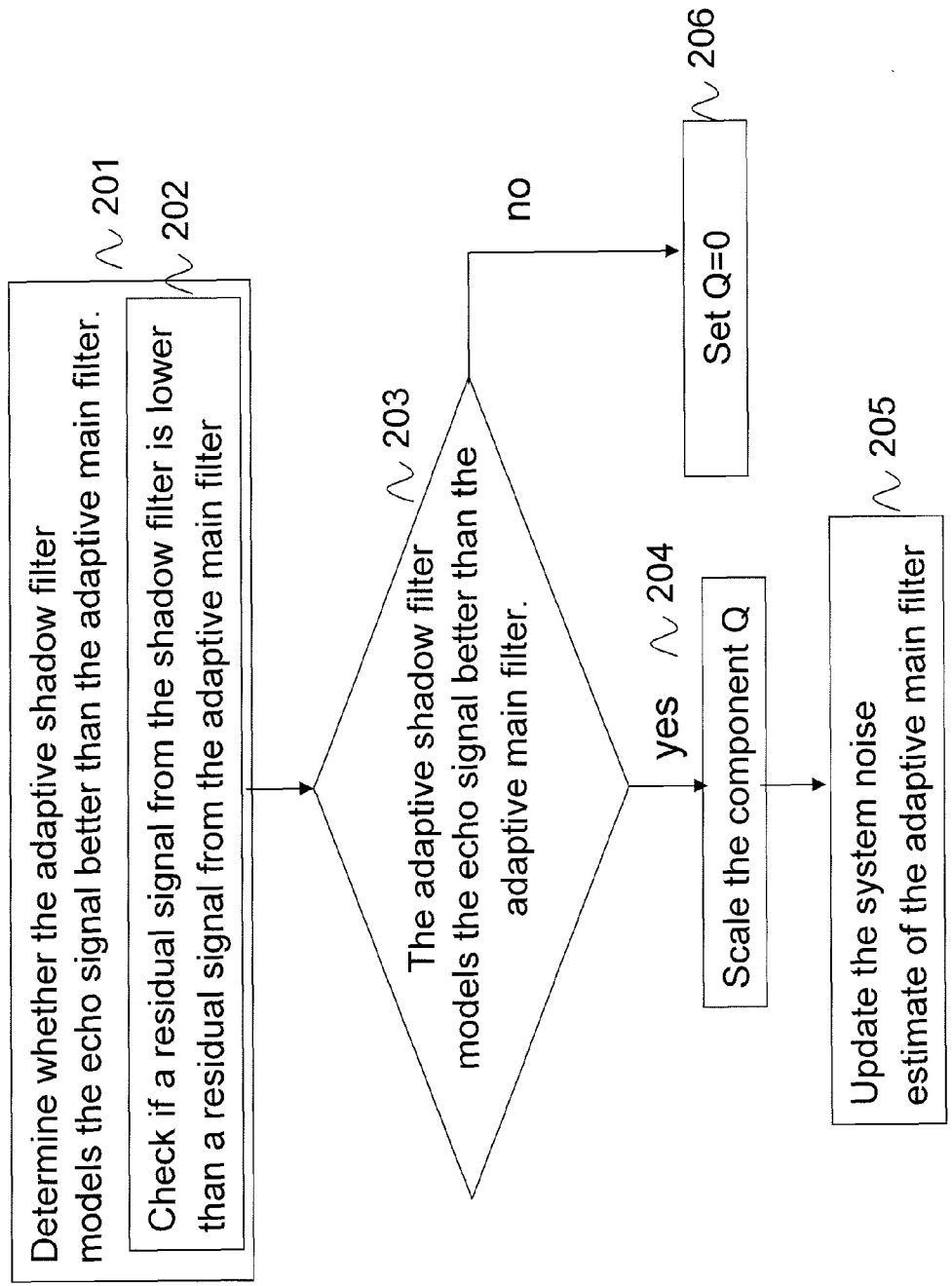
FIG. 2 is a flowchart of the method according to embodiments of the present invention.

As shown in the flowchart of FIG. 2 and in conjunction with FIG. 3, it is determined 201 by a processor 303 whether the adaptive shadow filter 302 models the echo signal better than the adaptive main filter. If the adaptive shadow filter models 203 the echo signal better than the adaptive main filter the system noise estimate of the adaptive main filter is updated 205 by an updater 304.

According to an embodiment of the present invention, the estimate of the system noise of the adaptive main filter is updated using a component Q which is dependent whether the adaptive shadow filter models the echo signal better than the adaptive main filter.

If the main filter models 203 the echo signal better than the shadow filter the main filter is maintained updated and $R_H(k, f)$ is also kept updated. However, Q is set 206 to zero or not taken into account when updating the $R_H(k, f)$. In this case it is being assumed that the system noise is zero and the updating of the main filter coefficients would result in coefficients that better approximate the echo path and $R_H(k, f)$ should be decreased.

Further, the degree of freedom, i.e. the number of free parameters, in the shadow filter may be lower than, or equal to, the degree of freedom of the adaptive main filter. Free parameters imply parameters that can be changed independently of each other. Thus, the time needed for estimating the free parameters increases with the number of free parameters. Therefore a model using less free parameters (i.e. lower degree of freedom) can follow changes in the system faster than a model using more free parameters (i.e. higher degree of freedom).

According to one embodiment of the present invention it is determined 202 by the processor 303 that the adaptive shadow filter 302 models the echo signal better than the adaptive main filter 301 if a residual signal from the adaptive shadow filter 302 is lower than a residual signal from the adaptive main filter 301. The residual signal e(t) is the difference between the microphone signal y(t) and the estimated echo signal. When determining if the residual signal from the adaptive shadow filter 302 is lower than the residual signal from the adaptive main filter, a security margin may be used. An example of how the security margin is determined is shown below:

$$\left(\sum_k e\_main\_filter(t-k)^2, k=0, \ldots, M-1\right) >$$
$$(T \times \sum_k shadow\_filter(e(t)^2, k=0, \ldots M-1)$$

where T is the security margin.

Thus the embodiments of the present invention describes a method to choose a time varying Q(k, f) in order to obtain a good trade-off between adapting the linear filter in situations when the echo path has changed, and keeping a good echo attenuation in situation when the power of the near end signal, the additive measurement noise, is increased.

As mentioned above, the shadow filter is continuously updated with a step size larger than or equal to the step size of the main filter, i.e. the adaption speed of the shadow filter is faster than the adaption speed of the main filter, e.g. using $$\alpha(k) = \frac{\mu}{R_X(k)}$$

where $\mu \approx 1$.

Preferably in case of a FIR filter, the length of the shadow filter should be shorter than the length of the main filter in order to further increase the update speed but also to reduce the memory requirements and the computational complexity.

Due to the constantly high adaptation gain, the shadow filter will converge more rapidly than the main filter in a situation with a change in the echo path, resulting in that the spectrum of the residual signal from the shadow filter is lower than that of the main filter, $$R_E^s(k,f) = |E^s(k,f)|^2 < |E^m(k,f)|^2 = R_E^m(k,f)$$

In a situation with double talk, the two spectra will be of similar power.

This information may be utilized to determine a suitable value of Q(k, f).

Once the filter has converged, the stability against double talk is inherent in the adaptive step size frequency domain NLMS method described above, due to its construction: $R_H(k, f)$ has converged to a small value and that results in a small update gain also in situations with increased power in E(k, f). Hence, with the choice Q(k,f)=0 or sufficiently small, $R_H(k, f)$ would be kept at a small value and the linear filter would stay in a converged state also during double talk.

This would, however, prevent the filter from being adapted to a new echo path if the echo path changes e.g. due to sudden movements in the echo path, which is also manifested by an increased power in E(k, f).

In order to re-adapt the filter, $R_H(k, f)$ has to be able to increase. This can either be performed by a direct modification of $R_H(k, f)$ or by choosing Q(k, f) sufficiently large so as to increase the adaptation speed. This is in a direct conflict with the case of preventing an erroneous update in double talk conditions, as described above.

Several methods for the choice of Q(k, f) have been proposed in prior art. A common choice is to make Q(k, f) proportional to the power of the magnitude response of the estimated filter, $$Q(k, f) \propto \Sigma |H_p(k, f)|^2 = ERL$$

With steady state conditions on the signal powers, this leads to that $$R_H(k, f)) \propto ERL \cdot \left(1 + \sqrt{1 + \frac{R_V(k, f))}{\beta \cdot ERL \cdot R_X(k, f))}}\right)$$

Thus, with this choice of Q(k, f), the residual echo will be influenced by the absolute value of H(k, f) and the powers of the near end signal v(t) and the loudspeaker signal x(t). This indicates that the echo suppression will be slightly degraded during double talk, and that the filter has to re-adapt when the double talk ends.

If the statistics of the change of the echo path was known, Q(k, f) may be set to a small value when the echo path is stable thus preventing divergence during double talk and to a larger value when a change in the echo path has occurred. This would however require some detection algorithm to determine when a change in the echo path has occurred.

Regarding the determination of Q, the parameter $R_H(k, f)$ shall reflect the averaged squared difference $|H_m(k, f) - H_0(k, f)|^2$ where $H_0(k, f)$ denotes the filter coefficients of a linear filter modeling the echo. When a significant change in the echo path has occurred, $|H_m(k, f) - H_0(k, f)|^2$ may be larger than $R_H(k, f)$. In such a situation, $R_H(k, f)$ should be updated towards $|H_m(k, f) - H_0(k, f)|^2$ in order to increase the adaptation speed, which is performed by setting Q(k, f) to a suitable value greater than zero.

As discussed above, in the case of a change in the echo path, the shadow filter will start converging faster than the main filter. Thus, the estimation error of the shadow filter will be smaller than the estimation error of the main filter, $$|H_s(k,f) - H_0(k,f)|^2 < |H_m(k,f) - H_0(k,f)|^2$$

and $$|H_m(k,f) - H_s(k,f)|^2 < 2 \cdot |H_m(k,f) - H_0(k,f)|^2$$

Thus, $|H_m(k, f) - H_s(k, f)|^2$ can be seen as an estimate of $|H_m(k, f) - H_0(k, f)|^2$ and is bounded upwards.

According to an embodiment of the present invention, a suitable choice of Q(k, f) is estimated based on the difference of the filter estimate of the shadow filter and the main filter:

$$\Delta H(k,f) = \rho \cdot \Delta H(k-1,f) + (1-\rho) \cdot (H_m(k-1,f) - H_s(k-1,f))$$

$$Q(k,f) \propto (\Delta H(k,f))^2, \text{ if } R_E^s(k,f) < R_E^m(k,f)$$

The factor ρ is included to perform an averaging of the difference of the two filter estimates. This limits the effects of a larger estimation error in the shadow filter due to the larger step size. Typically, ρ is in the order of 0.75.

A well-known problem for adaptive algorithms is exponential growth of the covariance matrix if the input signal is not persistently exciting. For the Kalman filter, this translates to a risk for an exponential growth of P(t) with the addition of $R_1(t)$ if the input signal is not persistently exciting. In the method according to the embodiments of the present invention, an exponential growth of $R_H(k, f)$ would occur if a too large Q(k, f) is added for a longer period when the input signal at the corresponding frequency is low (or zero). To alleviate the problem of the exponential growth, Q(k, f) may be scaled by $$\gamma(k, f) = \frac{R_X(k, f)}{\delta + \|R_X(k, f)\|_\infty}$$

Thus, with a suitable choice of δ the factor γ(k, f) will be close to zero for low level signals.

In order to limit the effect of any remaining slow exponential growth, the term proportional to $(\Delta H(k, f))^2$ is saturated as $$\max[(\Delta H(k, f))^2 - R_H(k-1, f), 0]$$

This will limit the update $R_H(k, f)$ to $(\Delta H(k, f))^2$ times a constant.

When scaling is used, the following expression for the choice of Q(k, f) can be added to the expression for the update of $R_H(k, f)$ using an optimal step size.

$$\Delta H(k, f) = \rho \cdot \Delta H(k-1, f) + (1-\rho) \cdot (H_m(k-1, f) - H_s(k-1, f))$$

$$Q(k, f) = \begin{cases} \beta[(\Delta H(k, f))^2 - R_H(k-1, f), 0] \cdot \frac{R_X(k, f)}{\delta + \|R_X(k, f)\|_\infty} & \text{if } R_E^s(k, f) < R_E^m(k, f) \\ & \text{otherwise} \end{cases}$$

The factor β is in the order of 0.25.

It should be noted that a similar expression also may be derived for the time domain NLMS with optimal step size.

Accordingly as illustrated in FIG. 2 in conjunction with FIG. 3, the echo canceller comprises a scaling unit 305 for scaling 204 the component Q before updating the adaptive main filter 301, where the scaling unit 305 may be configured to scale the component Q based on a difference between the corresponding filter parameters in the adaptive main filter 301 and the shadow filter 302.

Figure 4:
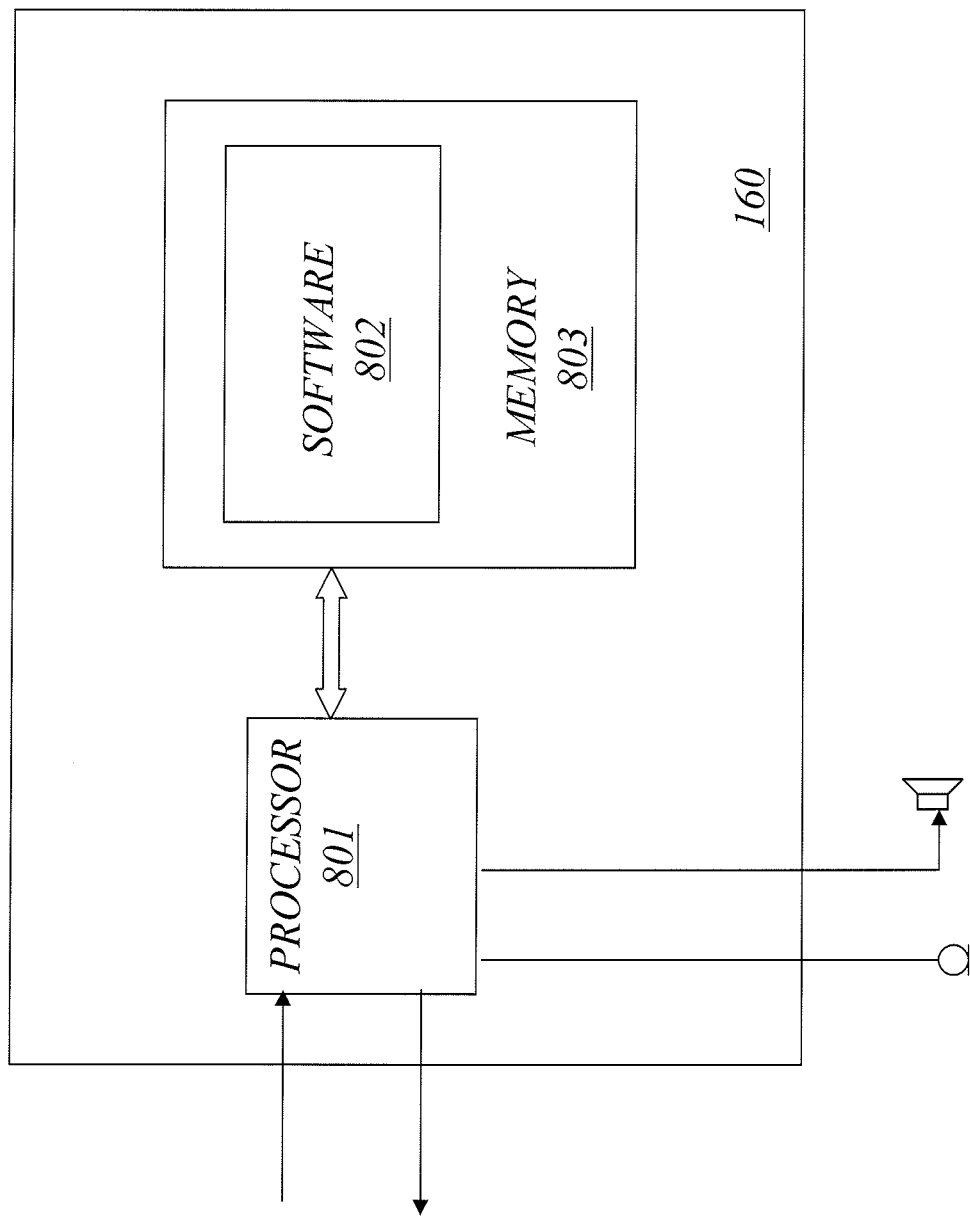
FIG. 4 exemplifies an implementation of the echo canceller according to embodiments of the present invention.

The functionalities within the box 350 of the echo canceller of FIG. 3 can be implemented by a processor 801 connected to a memory 803 storing software code portions 802 as illustrated in FIG. 4. The processor runs the software code portions to achieve the functionalities of the echo canceller according to embodiments of the present invention.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A method for estimating a model of an echo signal in an echo canceller comprising at least an adaptive main filter for modeling the echo signal and an adaptive shadow filter for modeling the echo signal, wherein the adaptation speed of the shadow filter is faster than the adaptation speed of the adaptive main filter, the method comprising:

determining whether the adaptive shadow filter models the echo signal better than the adaptive main filter, and updating a system noise estimate of the adaptive main filter in response to determining that the adaptive shadow filter models the echo signal better than the adaptive main filter.

2. The method according to claim 1, wherein the estimate of the system noise of the adaptive main filter is updated using a component which is dependent on whether the adaptive shadow filter models the echo signal better than the adaptive main filter.

3. The method according to claim 1, wherein the degree of freedom of the shadow filter is lower than, or equal to, the degree of freedom of the adaptive main filter.

4. The method according to claim 1, wherein the step of determining whether the adaptive shadow filter models the echo signal better than the adaptive main filter comprises:

determining if a residual signal from the adaptive shadow filter is lower than a residual signal from the adaptive main filter.

5. The method according to claim 4, wherein the step of determining if a residual signal from the adaptive shadow filter is lower than a residual signal from the adaptive main filter comprises using a security margin.

6. The method according to claim 2, comprising the further step of: scaling the component before updating the adaptive main filter.

7. The method according to claim 6, where the scaling of the component is performed based on a difference between the corresponding filter parameters in the adaptive main filter and the shadow filter.

8. An echo canceller for estimating a model of an echo signal comprising at least an adaptive main filter for modeling the echo signal and an adaptive shadow filter for modeling the echo signal, wherein the adaptive main filter is an adaptive filter for which the adaptation speed is proportional to a system noise estimate and the adaptation speed of the shadow filter is faster than the adaptation speed of the adaptive main filter, the echo canceller comprising: a processor for (i) determining whether the adaptive shadow filter models the echo signal better than the adaptive main filter and (ii) updating the system noise estimate of the adaptive main filter in response to a determination that the adaptive shadow filter models the echo signal better than the adaptive main filter.

9. The echo canceller according to claim 8, wherein the processor is configured to update the estimate of the system noise of the adaptive main filter using a component which is dependent on whether the adaptive shadow filter models the echo signal better than the adaptive main filter.

10. The echo canceller according to claim 8, wherein the degree of freedom of the shadow filter is lower than, or equal to, the degree of freedom of the adaptive main filter.

11. The echo canceller according to claim 8, wherein the processor is configured to determine whether the adaptive shadow filter models the echo signal better than the adaptive main filter by determining whether a residual signal from the adaptive shadow filter is lower than a residual signal from the adaptive main filter.

12. The echo canceller according to claim 11, wherein the processor is configured to determine whether the residual signal from the adaptive shadow filter is lower than the residual signal from the adaptive main filter using a security margin.

13. The echo canceller according to claim 9, wherein the processor comprises a scaling unit for scaling the component before updating the adaptive main filter.

14. The echo canceller according to claim 13, where the scaling unit is configured to scale the component based on a difference between the corresponding filter parameters in the adaptive main filter and the shadow filter.

15. The echo canceller according to claim 8, wherein the processor comprises one or more of: a microprocessor and an application specific integrated circuit (ASIC).

16. The echo canceller according to claim 8, wherein
the processor comprises a microprocessor, and
the echo canceller further comprises software for instructing the microprocessor to (i) determine whether the adaptive shadow filter models the echo signal better than the adaptive main filter and (ii) update the system noise estimate of the adaptive main filter in response to a determination that the adaptive shadow filter models the echo signal better than the adaptive main filter.

17. The method according to claim 1, wherein the adaptive main filter is an adaptive filter for which the adaptation speed is proportional to a system noise estimate of the adaptive main filter.

* * * * *